United States Patent [19]

Andoh

[11] Patent Number: 5,574,998
[45] Date of Patent: Nov. 12, 1996

[54] AUTOMATIC FREQUENCY CONTROL CIRCUIT FOR CONTROL OF REFERENCE OSCILLATOR IN COMMUNICATION APPARATUS

[75] Inventor: Akira Andoh, Hyogo, Japan

[73] Assignee: Mitsubishi Denki Kabushiki Kaisha, Tokyo, Japan

[21] Appl. No.: 446,805

[22] Filed: Dec. 6, 1989

[30] Foreign Application Priority Data

Aug. 10, 1989 [JP] Japan ................................. 1-207348

[51] Int. Cl.⁶ ...................................................... H04B 1/16
[52] U.S. Cl. .................................... 455/182.2; 455/192.2; 455/260
[58] Field of Search .................. 455/87, 182, 192, 455/259, 260, 314, 318, 75–76; 375/97

[56] References Cited

U.S. PATENT DOCUMENTS

| | | | |
|---|---|---|---|
| 4,691,377 | 9/1987 | Yoshihara et al. | 375/97 |
| 4,703,520 | 10/1987 | Rozanski, Jr. et al. | 455/182 |
| 4,715,001 | 12/1987 | Deem et al. | 455/182 |
| 4,932,072 | 6/1990 | Toko | 455/76 |
| 4,947,409 | 8/1990 | Raith et al. | 375/97 |

FOREIGN PATENT DOCUMENTS

| | | |
|---|---|---|
| 0044374 | 1/1982 | European Pat. Off. . |
| 0253680 | 1/1988 | European Pat. Off. . |
| 3738124 | 6/1988 | Germany . |

*Primary Examiner*—Andrew Faile
*Attorney, Agent, or Firm*—Rothwell, Figg, Ernst & Kurz

[57] ABSTRACT

An automatic frequency control device in which a burst frequency is sampled and held on the output side of an IF amplifier, the held frequency is measured and compared with a preset reference frequency data for obtaining a difference therebetween, and a reference oscillator is controlled so as to keep the difference below a predetermined value, by which the stabilization of an IF frequency and a transmitter carrier wave frequency, both of which are controlled by a reference frequency from said reference oscillator, can be accomplished.

8 Claims, 9 Drawing Sheets

AUTOMATIC FREQUENCY CONTROL CIRCUIT FOR CONTROL OF REFERENCE OSCILLATOR IN COMMUNICATION APPARATUS

BACKGROUND OF THE INVENTION

1. Field of the Invention

This invention relates to an automatic frequency control device which is applied to radio communication apparatus operating in a burst mode, for example, an automobile telephone or the like.

2. Description of the Prior Art

FIG. 1 is a block diagram showing the component configuration of a receiving unit of a conventional radio communication apparatus. In FIG. 1, reference numeral 1 is an antenna, 2 a high frequency amplifier which amplifies a received signal input to the antenna 1, 3 a frequency converter which mixes the amplified received signal from the high frequency amplifier 2 with a local oscillation signal to convert the received signal into an intermediate frequency signal, 4 an intermediate frequency amplifier which amplifies the intermediate frequency signal, 5 a demodulator which demodulates an output signal of the intermediate frequency amplifier 4 to obtain a baseband signal, 6 a phase-locked loop which operates as a sample and hold means and which comprises a phase comparator 7, a loop filter 8, a through/hold circuit 9, and a voltage controlled oscillator 10 (hereinafter abbreviated as VCO).

Reference numeral 11 is a synchronous circuit which operates by receiving a received burst signal contained in the demodulated data;. 12 is a control circuit which receives an output signal of the synchronous circuit 11 and sets the through/hold circuit 9 in a through state in a carrier reproducing portion of the receiving burst and sets the through/hold circuit 9 in a hold state in a data portion of the received burst; 13 is a reference oscillator; 14 is a receiving local oscillator which outputs a local oscillation signal in response to an oscillation signal of the reference oscillator 13 and 15 is a transmitting carrier wave oscillator which uses the frequency of oscillation of the reference oscillator 13 as a transmitting frequency.

Next, the operation will be described for the case where a carrier reproducing portion 102 of the received burst is continuously formed as shown in FIG. 2 and alternates with a data portion 101. A signal received by the antenna 1 is amplified by the high frequency amplifier 2 and then mixed with the local oscillation signal from local oscillator 14 to be converted into an intermediate frequency signal in the frequency converter 3. The intermediate frequency signal is amplified by the intermediate frequency amplifier 4 and the demodulated data is taken out of the demodulator 5.

The synchronous circuit 11 operates upon receiving the demodulated data, and the output signal of the control circuit 12 which has received the output signal of the synchronous circuit 11 sets the through/hold circuit 9 into a through state during the carrier wave reproducing portion 102 of the receiving burst. In this state, the frequencies and phases of the output signal of the VCO 10 and the intermediate frequency amplifier 4 are compared, the error output is outputted from the phase comparator 7, and the VCO 10 is controlled via the loop filter 8 and the through/hold circuit 9 by this error output to synchronize with the output of IF amplifier 4.

Next, in a data portion 101 of the received burst, the output signal of the control circuit 12 sets the through/hold circuit 9 into a hold state, by which the output frequency and phase of the VCO 10 after control is retained, and the output signal of the VCO 10 is supplied to the demodulator 5 to be used in the demodulation of the IF signal.

Since the receiving unit of a typical conventional radio communication apparatus is arranged as described above, that is, reference oscillator 13 is not subjected to phase-locked loop correction, the output frequencies of the receiving local oscillator 14 and the transmitting carrier wave oscillator 15 are varied by output variations of the reference oscillator 13. Therefore, in particular, when the allowable error in the transmitting carrier wave frequency is very small, the reference oscillator must be highly stable, which results in high cost.

A circuit arrangement similar to that shown in FIG. 1 is described in the form of a color synchronous circuit in the TV Engineering Handbook, first edition, edited by a corporate Juridical person, TV Society, published by OHM Co., Japan, pp. 12–79.

SUMMARY OF THE INVENTION

An object of this invention is to provide an automatic frequency control system in which a reference oscillator is controlled after receipt of a receiving frequency to stabilize the intermediate frequency and transmitting carrier frequency used in the reception and transmission of communication signals.

In order to accomplish the above-mentioned object, the automatic frequency control system of this invention is provided with a frequency sample and holding means which samples a receiving frequency in the carrier reproducing portion of the received burst and holds the frequency concerned during the data portion of the received burst, a frequency measuring means which measures the held receiving frequency, and a comparison and decision means in which the measured frequency data and reference frequency data from a reference oscillator are compared to control the reference oscillator to reduce the error to within a certain value, and is constructed so as to control the output frequency of the reference oscillator to follow the received frequency.

The present invention takes advantage of the fact that the local oscillator of a mobile telephone base station is highly stabilized in comparison to the local reference oscillator of a mobile station and thus can be advantageously used to correct the frequency of the mobile station reference oscillator.

DETAILED DESCRIPTION OF THE PREFERRED EMBODIMENTS

Preferred embodiments of this invention are hereinafter described in detail with reference to accompanying drawings.

Figure 1:
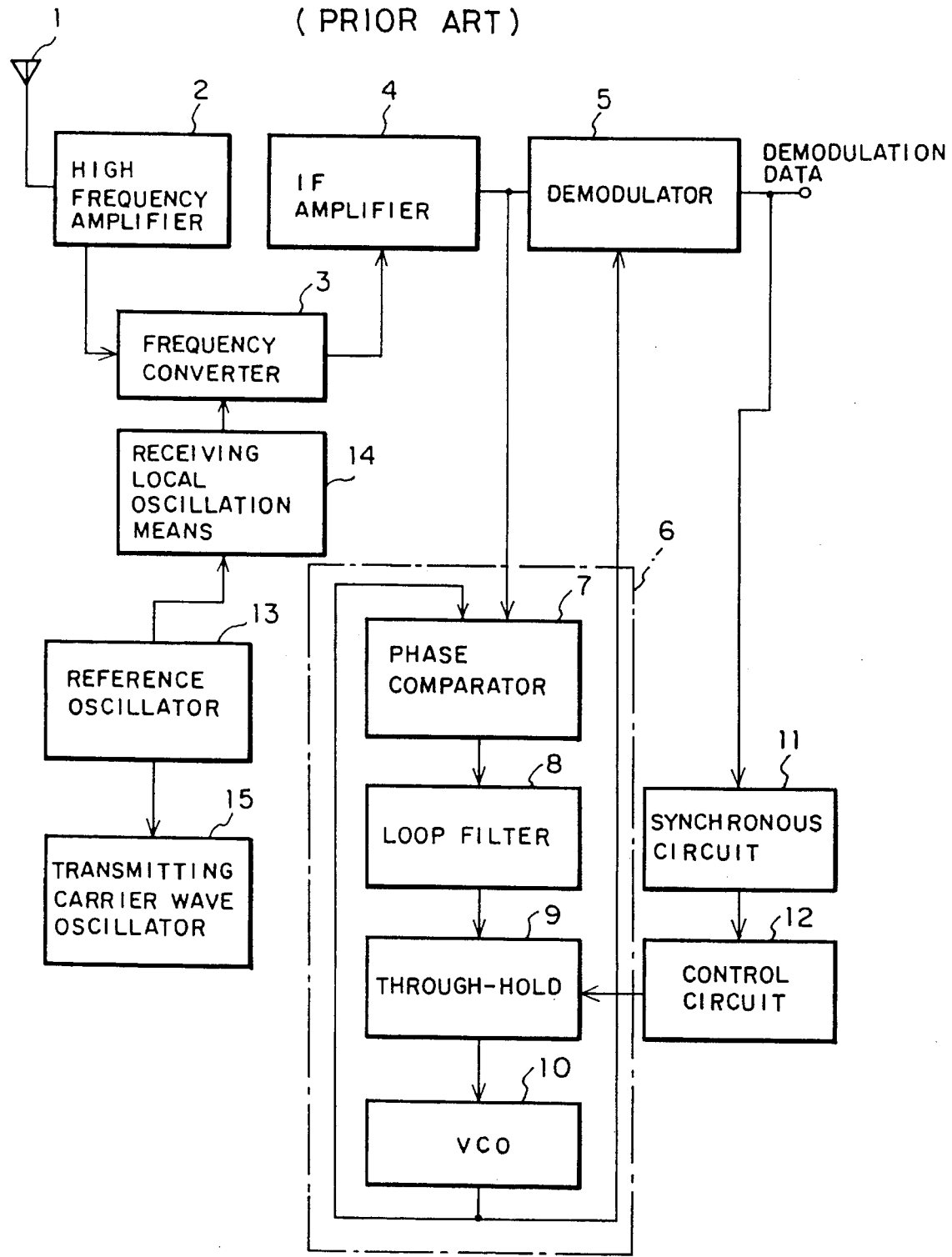
FIG. 1 is a block diagram of a receiving unit of a conventional radio communication apparatus.
Figure 3:
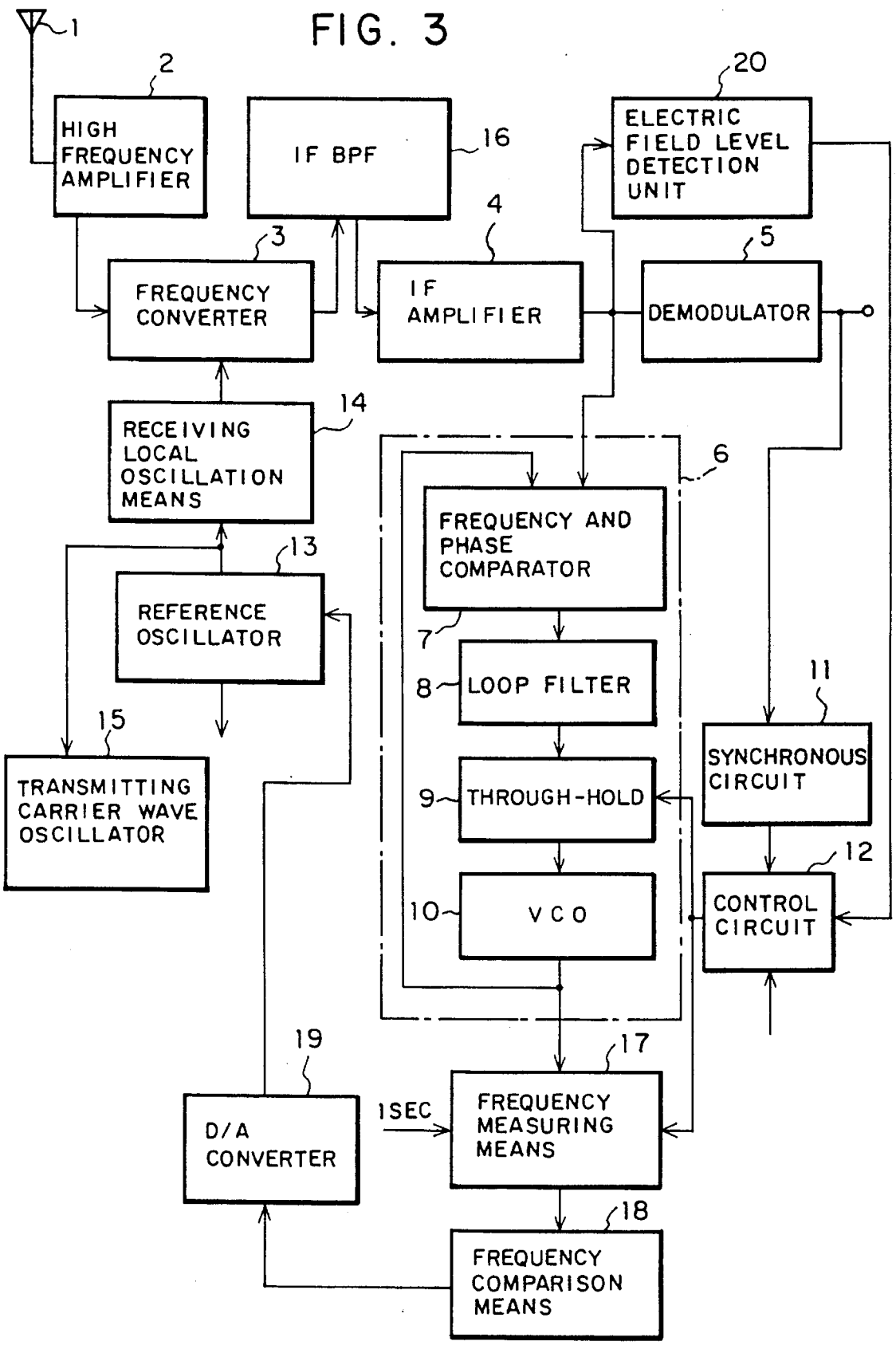
FIG. 3 is a block diagram showing a receiving unit of a radio communication apparatus provided with an automatic frequency control device according to an embodiment of this invention.

In FIG. 3, in which the same parts as those in FIG. 1 are identified by the same numerals to avoid duplication, reference numeral 16 is an intermediate frequency (IF) bandpass filter connected between the frequency converter 3 and the IF amplifier 4, 17 is a frequency measuring means composed of counters the input of which is the output of phase-locked loop 6, 18 is a frequency comparison means which comprises a sequence circuit composed of adders, latch circuits, and a reference frequency generator or a microprocessor and outputs a frequency error correction data in accordance with an output signal of the frequency measuring means 17, 19 is a digital-to-analog converter (hereinafter abbreviated as D/A converter), and 20 is a field intensity level detection circuit which detects the field intensity of the IF signal.

Figure 4:
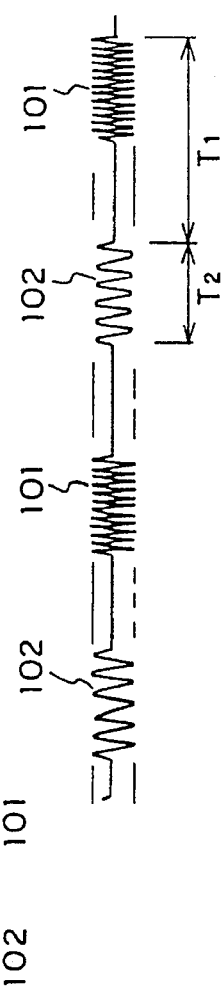
FIG. 4 is a wave diagram of received bursts.

FIG. 4 is a wave diagram of a received burst applied to the embodiments described above. The wave form includes a carrier reproducing portion 101 and a data portion 102 which are separated from each other.

Figure 5:
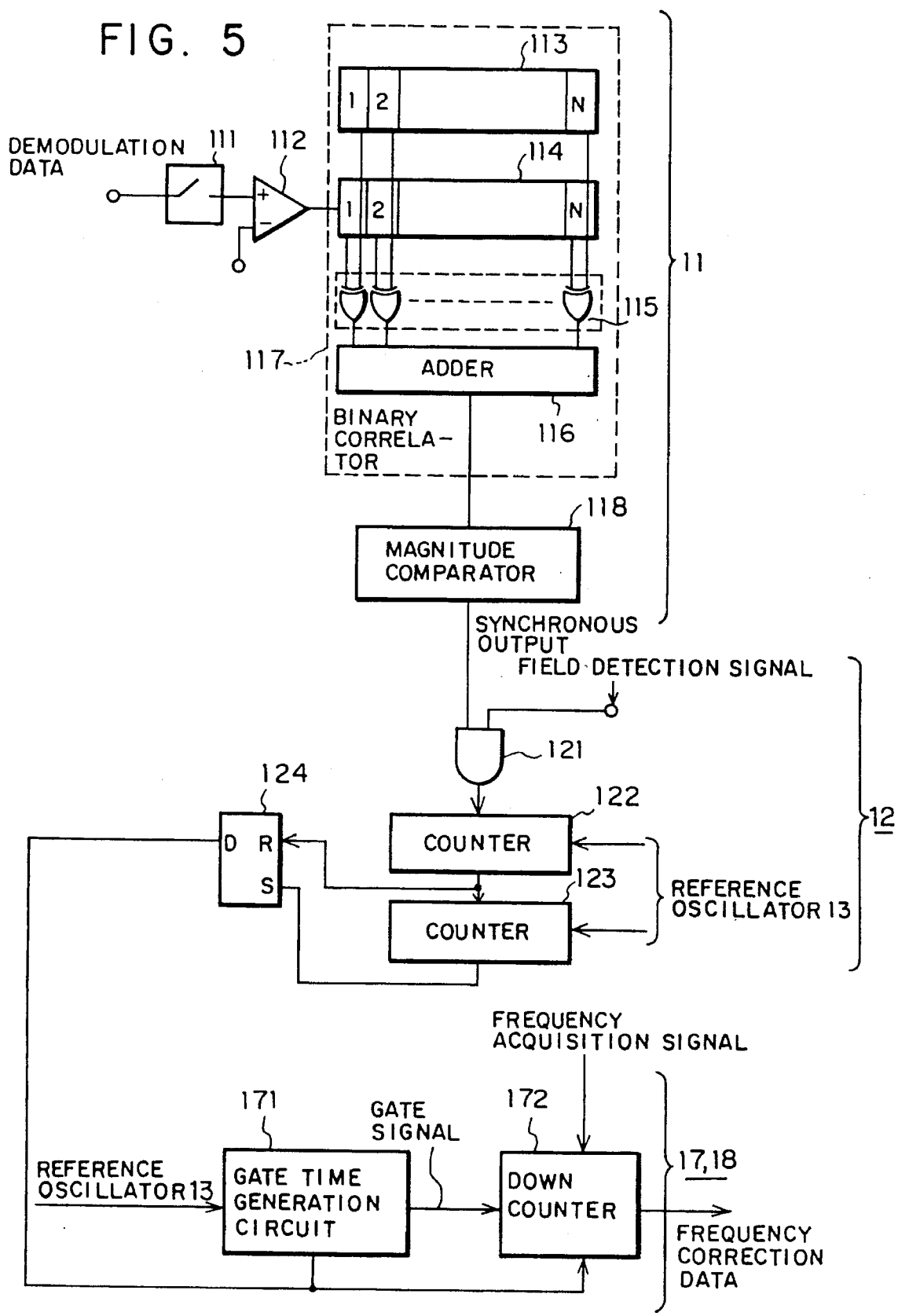
FIG. 5 is a block diagram of a principal circuit of FIG. 3.

FIG. 5 is a block diagram showing examples of arrangements of the synchronous circuit 11, the control circuit 12, the frequency measuring means 17, and the frequency comparison means 18 in the embodiment described above.

The synchronous circuit 11 comprises a binary correlator 117 and a magnitude comparator 118, the former having a sampler 111 for inputting demodulated data output from the demodulator 5, a comparator 112 for comparing an output signal of the sampler 111 with a reference signal, a reference register 113, a shift register 114, an exclusive OR circuit 115, and an adder 116.

The control circuit 12 comprises an AND gate 121 which obtains the logical AND of the synchronous signal output from the magnitude comparator 118 and the output signal from the electric field level detection unit 20, a counter 122 which receives the output signal from the AND circuit 121, begins counting of the reference oscillation signal from the reference oscillator 13 until the time $T_1$ shown in FIG. 4 elapses and a predetermined count number is reached, a counter 123 which receives the count up signal from the counter 122, begins counting of the reference signal from the reference oscillator 13 until the time $T_2$ shown in FIG. 4 elapses and a predetermined count number is reached, and a flip-flop 124 which is reset by the count up signal of the counter 122 and set by the count up signal of the counter 122 to output a control signal.

In short, the count up signal of the counter 122 brings the through/hold circuit 9 into a through state, and at the same time, makes the frequency measuring means 17 stop the measuring operation, and the count up signal of the counter 123 brings the through/hold circuit 9 into a hold state, and at the same time, makes the frequency measuring means 17 start the measuring operation.

The frequency measuring means 17 and the frequency comparison means 18 comprise a gate time generation circuit 171 which has been supplied with the reference oscillation signal from the reference oscillator 13 and starts its operation upon the reception of the control signal from control circuit 12 and a down counter 172 which starts its operation upon the reception of the control signal, subtracts the held frequency signal from the phase-locked loop until it receives gate signal from the gate time generation circuit 171, and outputs frequency correction data.

Next, the operation of the embodiment will be described. Since the operation of reception, and that of acquisition and holding of a frequency are same as those in FIG. 1 described above, the duplicated description is omitted. The operation of an automatic frequency control device in this invention will be described in the following.

As described above, upon initiation of holding of a receiving frequency in the carrier reproducing portion 102 of the received burst, the frequency is measured by the frequency measuring means 17. The result of frequency measurement thus obtained is sent to the frequency comparison means 18 and compared with an IF reference data preset in a memory in the frequency comparison means 18 which, as one example, may be 10.7 MHz, by which a correction data corresponding to the frequency difference between them is output.

Figure 6:
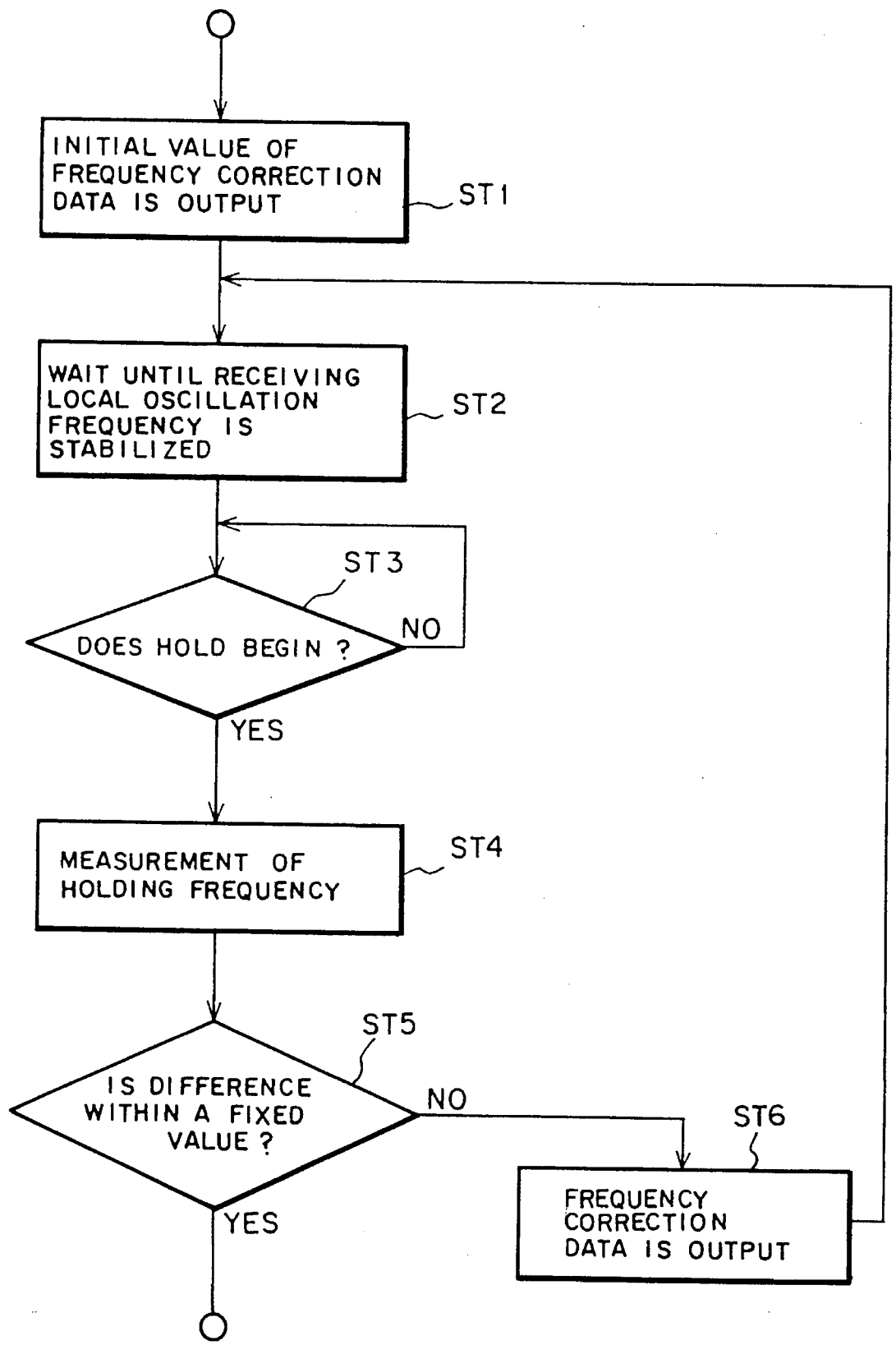
FIG. 6 is a flowchart explanatory of the operation of the automatic frequency control device shown in FIG. 3.

As shown in the flowchart of FIG. 6, the frequency comparison means 18 outputs an initial value of a frequency correction data at step ST1. Next, the means 18 waits until an oscillation frequency of the receiving local oscillator 14 becomes stable (Step ST2) and decides whether holding starts or not (Step ST3). In the case of YES, the means 18 measures the held frequency (Step ST4) and decides whether the difference between the measured frequency data and the reference frequency data is within a fixed value or not (Step ST5), and in the case of NO, the means 18 outputs a frequency correction data and returns to the Step ST2 (Step ST6).

After the frequency correction data output from the frequency comparison means 18 is converted into an analog signal by the D/A converter 19, it is added to the reference oscillator 13. As a result, the reference oscillator 13 is controlled to follow the received frequency, and consequently, an IF frequency becomes constant, and at the same time, the oscillation frequency of the transmitting carrier wave oscillator 15 becomes stable.

An electric field detector 20 monitors a received electric field level, and disables the control circuit 12 When the received field level is low by sending a logical "0" to AND circuit 121 shown in FIG. 5. As a result, when the received electric field level is low, the reference oscillator 13 cannot be controlled and the previous reference oscillation frequency is used as it is.

Figure 7:
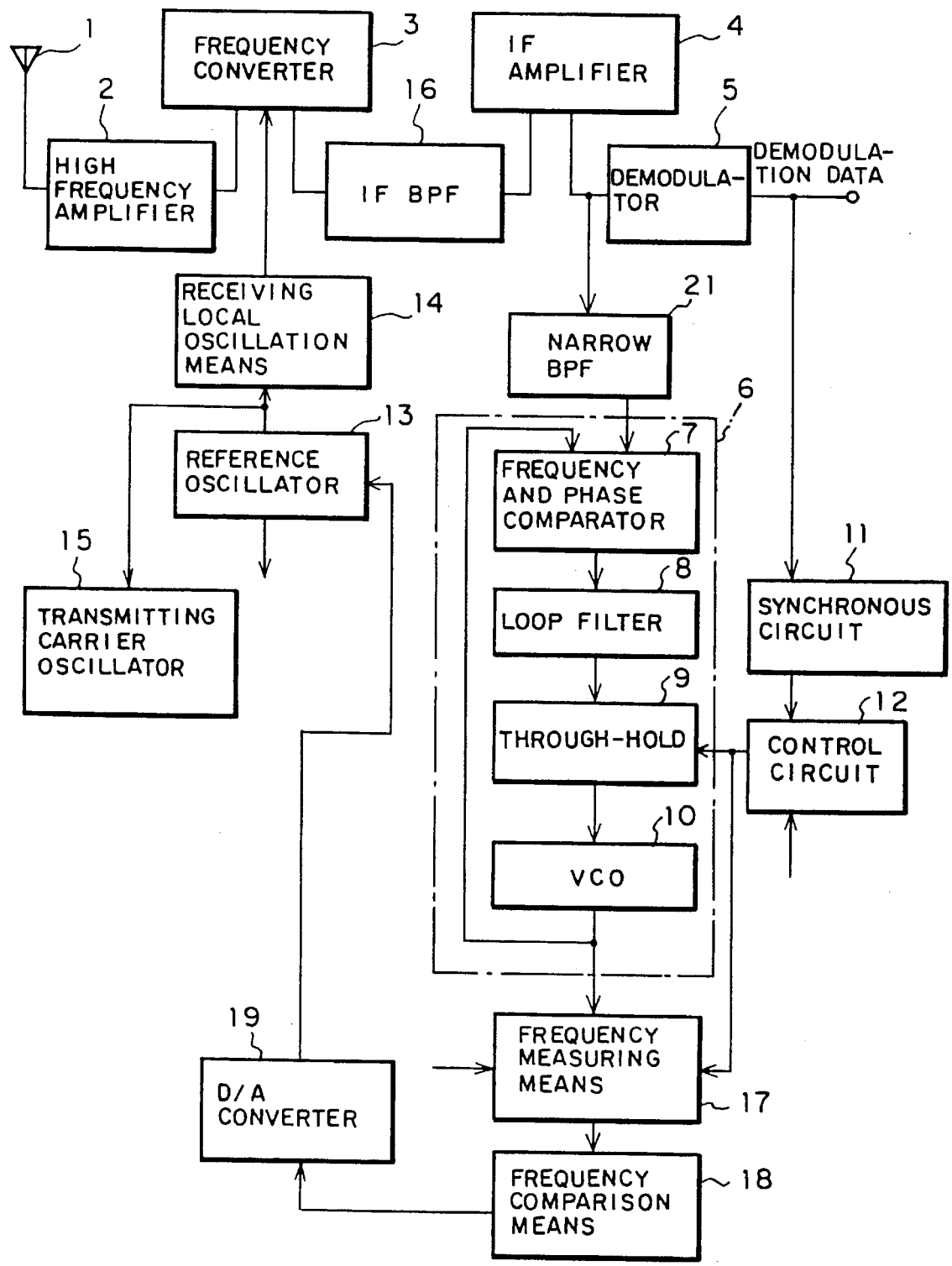
FIGS. 7 and 8 each are a block diagram showing a receiving unit of a radio communication apparatus provided with an automatic frequency control device according to another embodiment of this invention.

FIG. 7 shows an example in which a narrow bandpass filter 21 is provided on the input side of the phase-locked loop 6 in the constitution in FIG. 3 described above. This constitution allows the sensitivity in a weak electric field to be raised, and, the automatic frequency control to be effectively done even in the case of a weak antenna input.

Figure 8:
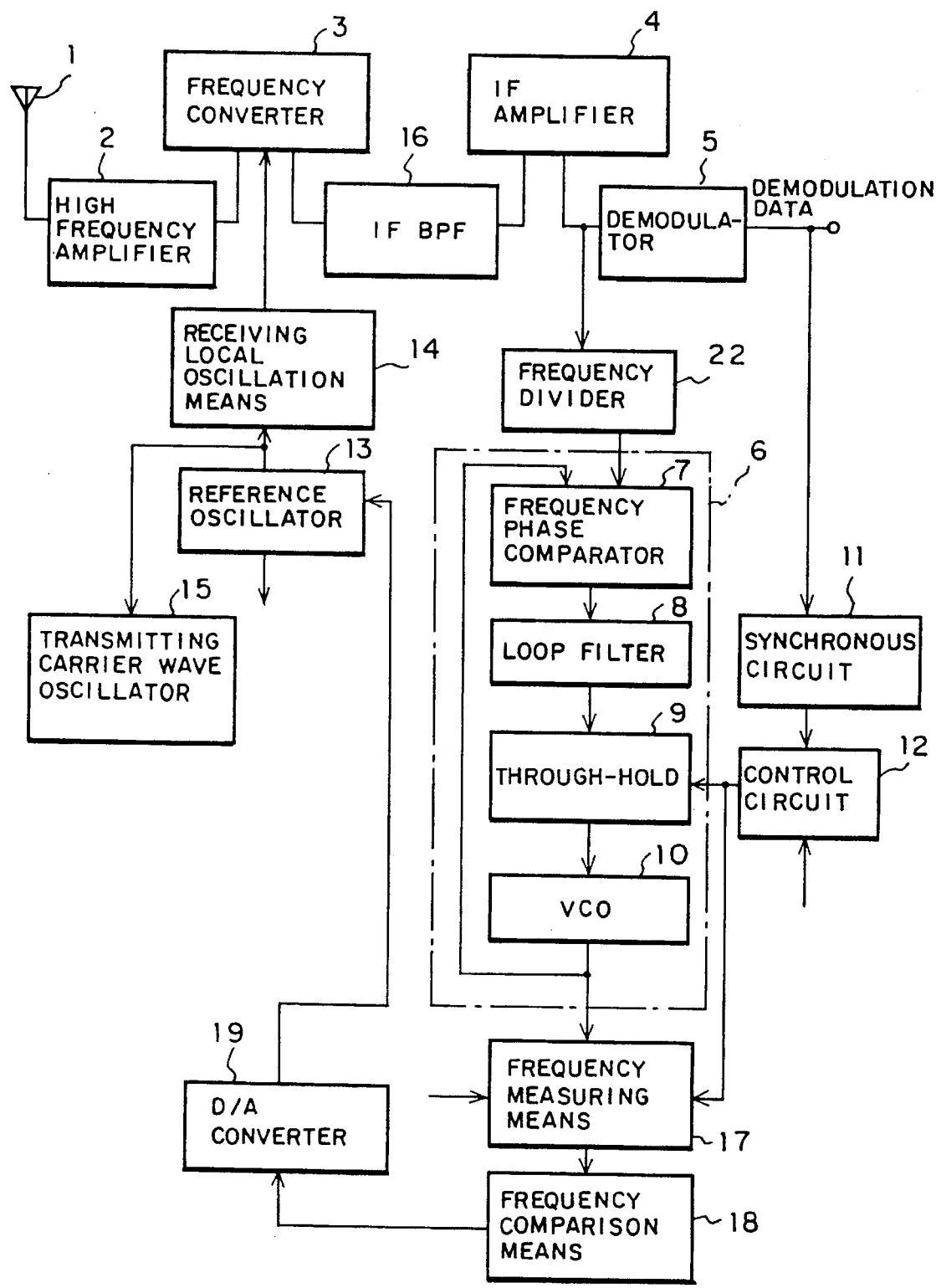

FIG. 8 shows an example in which a frequency divider 22 is provided on the input side of the phase-locked loop 6 in the constitution in FIG. 3 described above. This constitution divides the IF down to a frequency which is easy to process to sample the IF frequency, allowing it to be input to the phase-locked loop 6.

Figure 9:
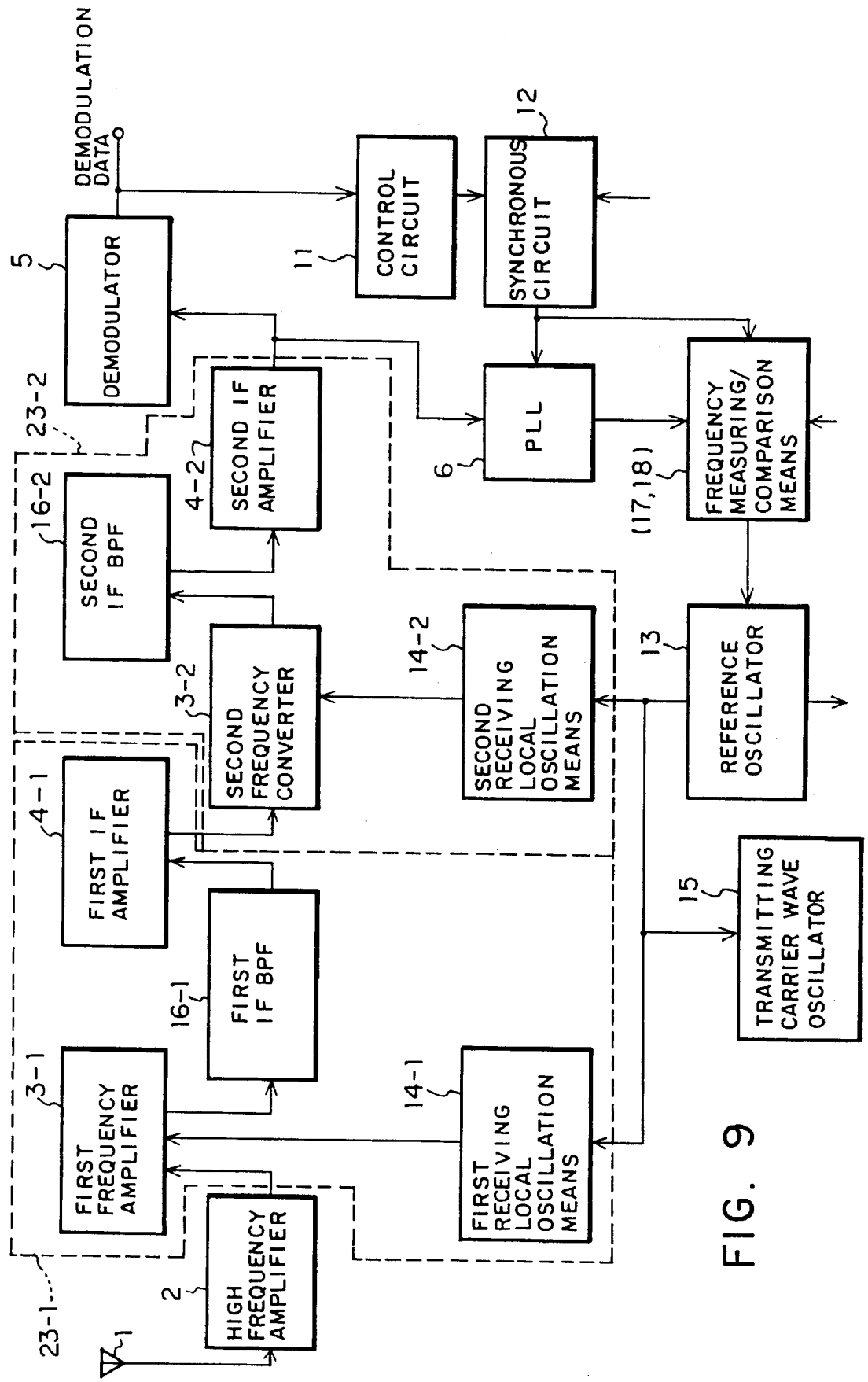
FIG. 9 is a block diagram showing a double superheterodyne receiving unit provided with an automatic frequency device according to an embodiment of this invention.

Each embodiment described above shows a constitution of a single superheterodyne receiving unit having one IF frequency. FIG. 9 shows a constitution of a double superheterodyne receiving unit having two IFs, which is provided with a first IF generating unit 23-1 comprising a first frequency converter 3-1, a first IF amplifier 4-1, a first IF BPF 16-1, and a first receiving local oscillator 14-1 and a second IF generating unit 23-2 comprising a second frequency converter 3-2, a second IF BPF 16-1, a second IF amplifier 4-2, and a second receiving local oscillator 14-2. The double superheterodyne receiving unit can make the two IF frequencies constant by controlling the first and second receiving local oscillators 14-1 and 14-2 by using the output of the reference oscillator 13.

The case in which a frequency in the carrier reproducing portion 102 of the received burst becomes constant is assumed. Even in the case where signals are modulated by an arbitrary data pattern using such a modulation method as a GMSK method, the so-called Costas loop in which an error component between the frequency of the received carrier, obtained by the result of the multiplication of the in-phase component I and the orthogonal component Q, and the reproduced clock and the oscillation frequency of the VCO 10 is detected. The error component is fed back to the VCO 10, and the PLL 6 is brought into a hold state, by which an automatic frequency control device which performs the same action as each of the embodiments described above can be constituted.

Figure 2:
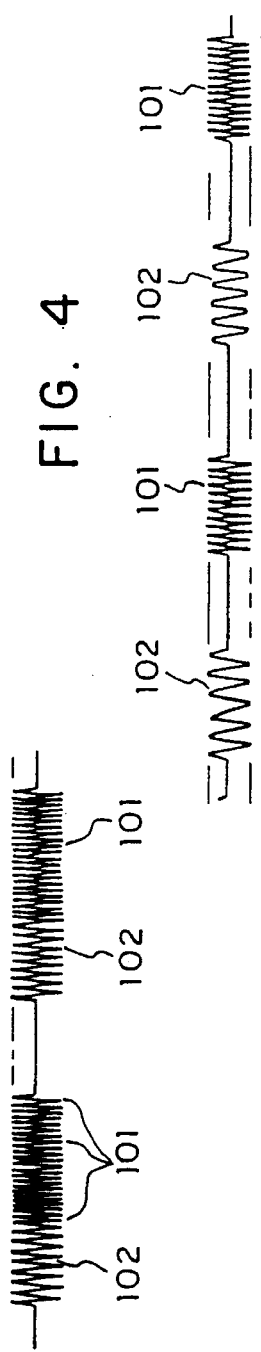
FIG. 2 is a wave diagram of a received burst.
Figure 10:
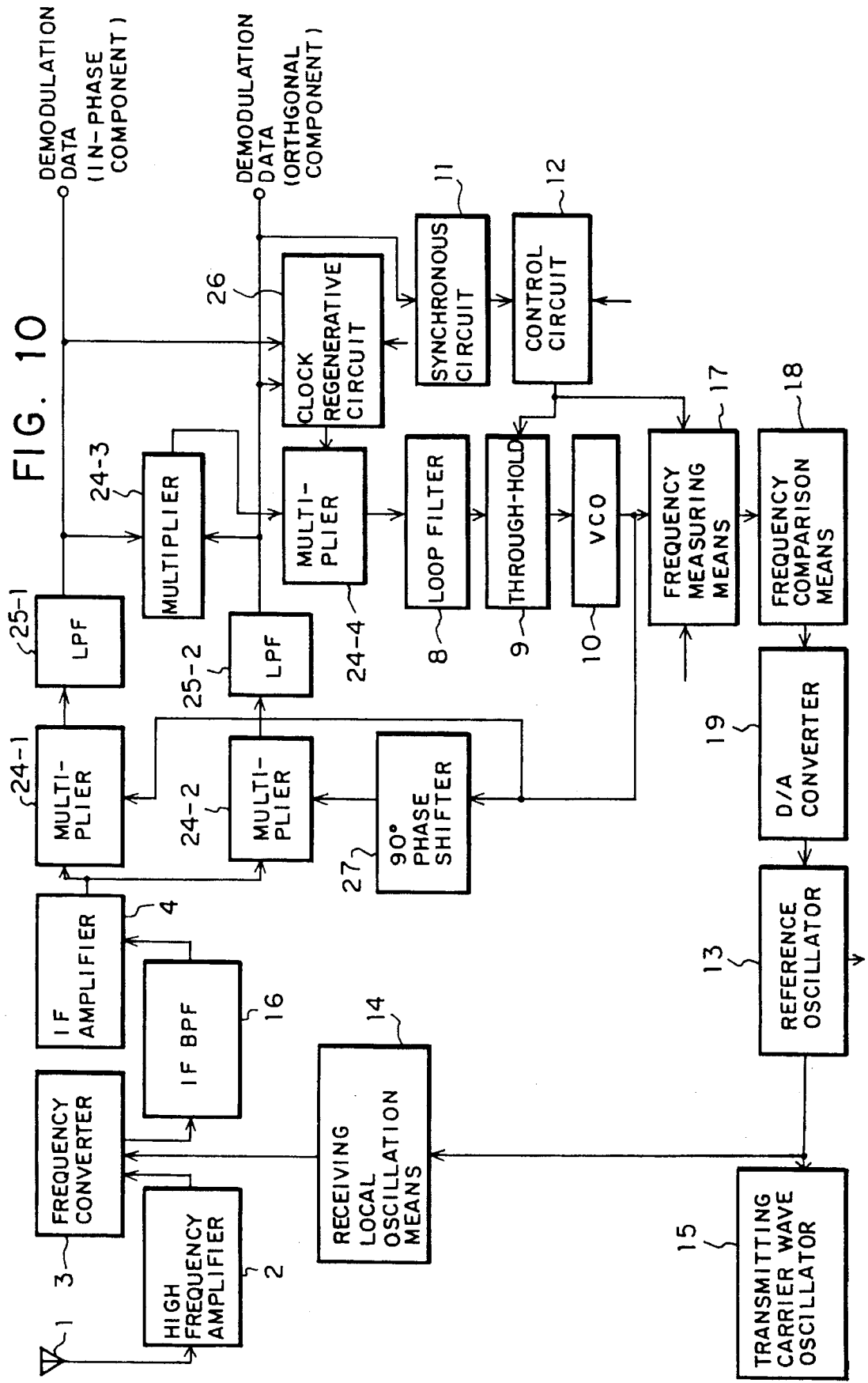
FIG. 10 is a block diagram showing another arrangement of a receiving unit of a radio communication apparatus provided with an automatic frequency control device according to an embodiment of this invention.

FIG. 10 is a block diagram showing a constitution of a receiving unit provided with an automatic frequency control device using a costas loop, and the same parts as those in FIG. 2 are identified by the same reference numerals to omit duplicated description.

In FIG. 10, reference numeral 24-1 denotes a first multiplier, 24-2 a second multiplier, 25-1 a first lowpass filter (LPF), 25-2 a second lowpass filter (LPF), 24-3 a third multiplier, 24-4 a fourth multiplier, 26 a clock regenerative circuit, and 27 a 90° phase shifter.

Figure 11:
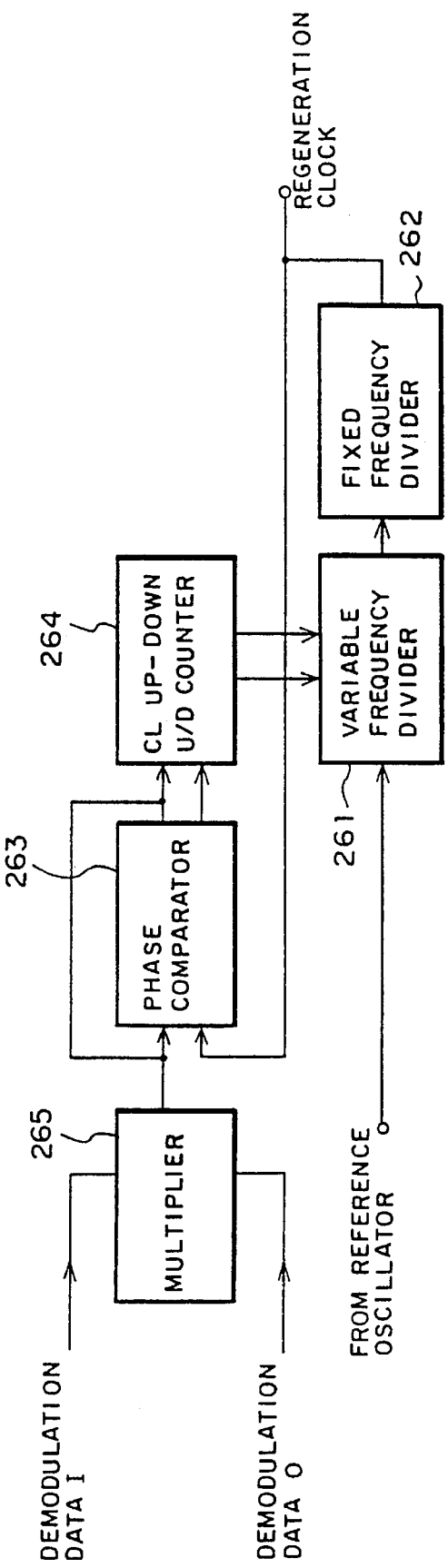
FIG. 11 is a block diagram showing an arrangement of the clock reproducing circuit 26 of FIG. 10.

FIG. 11 is a block diagram showing a concrete constitution of the clock reproducing circuit 26 of FIG. 10. The clock reproducing circuit 26 comprises a variable frequency divider 261 which divides the frequency of the reference oscillation signal from the reference oscillator 13, a fixed frequency divider 262 which divides tile frequency of an output signal of the variable frequency divider 261 and outputs a reproduced clock, a phase comparator 263 which compares a phase of an output signal of a multiplier 265 with the phase of the reproduced clock. Multiplier 265 outputs a signal equal to the product of the in-phase component I and the orthogonal component Q of the demodulated data. An up/down counter 264 receives an output signal of tile multiplier 265(?) at its clock terminal and an output signal of tile phase comparator 263 is inputted to its up/down terminal to perform up/down counting and the counted result is fed back to the variable frequency divider 261, thereby performing control so as to make the phase of tile output signal of the multiplier 24-1 coincide with that of tile reproduced clock.

The first multiplier 24-1 is supplied with an output signal from the IF amplifier 4 and an output signal of the VCO 10. Assuming that an angular frequency slip $\Delta\omega$ exists in an angular frequency $\omega_c$ in the expression $S(t) = I(t)\cos\omega_c t + Q(t)\sin\omega_c t$, the following operation is performed.

$$S(t)\cdot\cos(\omega_c+\Delta\omega)t = S(t)(\cos\omega_c t\cos\Delta\omega t - \sin\omega_c t\sin\Delta\omega t)$$

-continued
$$= (I(t)\cos\omega_c t + Q(t)\sin\omega_c t)(\cos\omega_c t\cos\Delta\omega t - \sin\omega_c t\sin\Delta\omega t)$$
$$= I(t)(\cos^2\omega_c t\cos\Delta\omega t - \cos\omega_c t\sin\omega_c t\sin\Delta\omega t) +$$
$$Q(t)(\sin\omega_c t\cos\omega_c t\cos\Delta\omega t - \sin^2\omega_c t\sin\Delta\omega t)$$
$$= I(t)\{½(1 + \cos^2\omega_c t)\cos\Delta\omega t - ½\sin^2\omega_c t\sin\Delta\omega t\} +$$
$$Q(t)\{½\sin^2\omega_c t\cos\Delta\omega t - ½(1 - \cos^2\omega_c t)\sin\Delta\omega t\}$$
$$= ½I(t)(\cos\Delta\omega t + \cos^2\omega_c t\cos\Delta\omega t - \sin^2\omega_c t\sin\Delta\omega t) +$$
$$½Q(t)(\sin\Delta\omega t + \cos^2\omega_c t\cos\Delta\omega t + \cos^2\omega_c t\sin\Delta\omega t)$$

Then, the first lowpass filter 25-1 filters the output of the first multiplier 24-1 and outputs the following signal.

$$½\cdot I(t)\cos\Delta\omega t - ½\cdot Q(t)\sin\Delta\omega t$$

On the other hand, the second multiplier 24-2 receives the output signal of the IF amplifier 4 and the output signal of the 90° phase shifter 27, which represents a 90° phase shifted VCO signal, and performs the following operation.

$$S(t)\sin(\omega_c + \Delta\omega)t = (I(t)\cos\omega_c t +$$
$$Q(t)\sin\omega_c t)(\sin\omega_c t\cos\Delta\omega t + \cos\omega_c t\sin\Delta\omega t)$$
$$= I(t)(½\sin^2\omega_c t\cos\Delta\omega t + ½\sin^2\omega_c t\sin\Delta\omega t) +$$
$$Q(t)\{\sin^2\omega_c t\cos\Delta\omega t + ½\sin^2\omega_c t\sin\Delta\omega t\}$$
$$= I(t)\{½\sin^2\omega_c t\cos\Delta\omega t + ½(1 + \cos^2\omega_c t)\sin\Delta\omega t\} +$$
$$Q(t)\{½(1 - \cos^2\omega_c t)\cos\Delta\omega t + ½\sin^2\omega_c t\sin\Delta\omega t\}$$
$$= ½I(t)(\sin\Delta\omega t + \cos^2\omega_c t\sin\Delta\omega t + \sin^2\omega_c t\cos\Delta\omega t) +$$
$$½Q(t)(\cos\omega\Delta t + \sin^2\omega_c t\sin\Delta\omega t - \cos^2\omega_c t + \cos\Delta\omega t)$$

Then, the second lowpass filter 25-2 filters the output signal of the second multiplier 24-2 and outputs the following signal.

$$½I(t)\sin\Delta\omega t + ½Q(t)\cos\Delta\omega t$$

Next, the third multiplier 24-3 multiplies the output of the first lowpass filter 25-1, and the output of the second lowpass filter 25-2. The output signals of multipliers 25-1 and 25-2 can be represented by the following.

$$½I(t)\cos\Delta\omega t - ½Q(t)\sin\Delta\omega t$$
$$= ½\{\sin\phi(t)\cos\Delta\omega t - \cos\phi(t)\sin\Delta\omega t\}$$
$$= ½\sin(\phi(t) - \Delta\omega t)$$

and $$½I(t)\sin\Delta\omega t + ½Q(t)\cos\Delta\omega t$$
$$= ½\{\sin\phi(t)\sin\Delta\omega t + \cos\phi(t)\cos\Delta\omega t\}$$
$$= ½\cos(\phi(t) - \Delta\omega t)$$

and the product of these expressions is calculated to be $$¼\sin(\phi(t) - \Delta\omega t)\cos(\phi(t) - \Delta\omega t) = ⅛\sin(2\phi(t) - 2\Delta\omega t)$$

where $\rho(t) = \pi/2T$ t: mark, and $-\pi/2T$ t: space
Then the fourth multiplier 24-4 obtains $$⅛\cdot\sin^2\Delta\omega t$$

as the product of the output signal of the third multiplier 24-3 and the output signal of the clock reproducing circuit 26, that is, the reproduced clock timing signal $V(t)=\cos(\pi/T\cdot t)$.

The output signal of the fourth multiplier 24-4 is fed back via the loop filter 8 and the through/hold circuit 9 in a through state to the VCO 10, and the received carrier wave frequency retained in the VCO 10 is measured by the frequency measuring means 17 when the through/hold circuit 9 is in a hold state.

The result of this frequency measurement is compared with the preset frequency reference data by the frequency comparison means 18, and the frequency correction data corresponding to the difference frequency is converted into an analog signal by the D/A converter 19. Then, the analog signal is supplied to the reference oscillator 13 to control the reference oscillator 13 to follow the received carrier frequency.

Incidentally, in each embodiment described above, the case where the received burst in which the data portion 101 and the carrier reproducing portion 102 are not contiguous with each other is applied as shown in FIG. 4 has been described. But, as shown in FIG. 2, the received burst in which both portions are contiguous is similarly applicable.

As described above, according to this invention, a receiving frequency is stored and held, the held receiving frequency is measured to compare it with the preset frequency reference, and the reference oscillator is controlled in response to the frequency correction data corresponding to the difference between the preset frequency and the held receiving frequency. Accordingly, the IF can be made constant without the use of an expensive reference oscillator, and the oscillation frequency of the transmitting carrier oscillator is stabilized.

What is claimed is:

1. An automatic frequency control device, comprising:
   a reference oscillator which supplies a reference frequency to a receiving local oscillator and a transmitting carrier wave oscillator;
   a frequency converter which converts which converts an output signal of a high frequency amplifier for amplifying a received signal, into a predetermined IF frequency according to an output of said receiving local oscillator;
   an IF amplifier for amplifying said IF signal;
   a demodulator which obtains a demodulated data signal from said amplified IF signal;
   frequency sample and holding means which samples and holds a burst frequency contained in said IF signal outputted by said IF amplifier;
   measuring means for measuring the frequency held by said frequency sample and holding means; and
   frequency comparison means for comparing measured frequency data from said frequency measuring means with a preset reference frequency data and outputting a correction signal equal to the difference between said measured and reference frequency data, and for controlling a reference oscillation frequency of said reference oscillator with said correction signal so as to maintain said difference below a predetermined value.

2. An automatic frequency control device according to claim 1, wherein said frequency sample and holding means includes a voltage controlled oscillator, a frequency and phase comparator supplied with the output signal of said IF amplifier and the output signal of said voltage controlled oscillator, a loop filter for passing the output signal of the frequency and phase comparator therethrough, and a through/hold circuit for forwarding an output signal of the loop filter to said voltage controlled oscillator or holding said output signal, said control device further comprising:
   a synchronous circuit which produces an Output signal in synchronism with a received burst contained in said demodulated data; and
   a control circuit which controls said through/hold circuit to be in a through state in response to said output signal from said synchronous circuit, and activates said frequency measuring means when said through/hold circuit is in a hold state.

3. An automatic frequency control device according to claim 2, further comprising an electric field level detecting unit which disables said control circuit when an output level of said IF amplifier is below a fixed value.

4. An automatic frequency control device according to claim 1, wherein said frequency measuring means includes at least one counter for counting the number of cycles of said held burst frequency, and said frequency comparison means is composed of a sequence circuit including a latch circuit for latching an output of said at least one counter, and an adder for obtaining the difference between a preset frequency value and the contents of said latch circuit.

5. An automatic frequency control device according to claim 1, further comprising a narrow bandpass filter which supplies an output signal of said IF amplifier to said frequency sample and holding means.

6. An automatic frequency control device according to claim 1, further comprising a frequency divider which supplies an output signal of said IF amplifier to said frequency sample and holding means.

7. An automatic frequency control device, comprising:
   a reference oscillator which supplies a reference frequency to a first receiving local oscillator, a second receiving local oscillator and a transmitting carrier wave oscillator;
   a first frequency converter which converts which converts an amplified high frequency received signal into a predetermined first IF frequency according to an output of said first receiving local oscillator;
   a first IF amplifier for amplifying said first IF signal;
   a second frequency converter which converts said amplified first IF signal into a predetermined second IF signal according to an output of said second receiving local oscillator;
   a second IF amplifier for amplifying said second IF signal;
   a demodulator which obtains demodulated data from said amplified second IF signal;
   frequency sample and holding means which samples and holds a burst frequency contained in said amplified second IF signal outputted by said second IF amplifier;
   measuring means for measuring the frequency held by said frequency sample and holding means; and
   frequency comparison means for comparing measured frequency data from said frequency measuring means with a preset reference frequency data and outputting a correction signal equal to the difference between said measured and reference frequency data, and for controlling a reference oscillation frequency of said reference oscillator with said correction signal so as to maintain said difference below a predetermined value.

8. An automatic frequency control device according to claim 1, wherein said frequency sample and holding means comprises:
   a voltage controlled oscillator;
   a first multiplier into which output signals of said IF amplifier and said voltage controlled oscillator are input;
   a second multiplier into which an output signal of said IF amplifier and a 90° phase shifted output signal of said voltage controlled oscillator are input;
   a third multiplier into which low-pass-filtered output signals of said first and second multipliers are input;
   a fourth multiplier into which an output signal of said third multiplier and a reproduced clock from a clock regenerative circuit are input;
   a loop filter which passes an output signal of said fourth multiplier; and a through/hold circuit which forwards an output signal of the loop filter to said voltage controlled oscillator or holds the output signal thereof;

and further comprising a synchronous circuit which produces an output signal in synchronism with a received burst contained in a demodulated data constituted by the low pass filtered Signal of said second multiplier, and a control circuit which controls said through/hold circuit to be in a through state in response to said output signal from said synchronous circuit, and activates said frequency measuring means when said through/hold circuit is in a hold state.

* * * * *